United States Patent [19]

Bruder et al.

[11] Patent Number: 4,463,449
[45] Date of Patent: Jul. 31, 1984

[54] FIELD EFFECT TRANSISTOR CORE MEMORY SWITCHING SYSTEM AND METHOD

[75] Inventors: John F. Bruder, Phoenix; Sam L. Rainwater, Tempe, both of Ariz.

[73] Assignee: Quadri Corporation, Tempe, Ariz.

[21] Appl. No.: 284,615

[22] Filed: Jul. 20, 1981

[51] Int. Cl.³ .............................................. G11C 7/02
[52] U.S. Cl. .................................... 365/196; 365/209; 365/230
[58] Field of Search ............... 365/129, 130, 189, 196, 365/206, 209, 230

[56] References Cited

U.S. PATENT DOCUMENTS 4,358,832 11/1982 Warner ............................... 365/196

Primary Examiner—James W. Moffitt
Attorney, Agent, or Firm—Cahill, Sutton & Thomas

[57] ABSTRACT

A core memory system includes a plurality of word lines strung through a core memory array and a plurality of field effect transistors coupling respective ones of the word select lines to an address decoding circuit. In one embodiment of the invention, the field effect transistors are utilized in conjunction with a transformer selection system. In the transformer selection system, the drain electrodes of each field effect transistor are connected in series with respective ones of a plurality of secondary windings of a transformer. The system includes a plurality of such transformers, the primary windings of the various transformers being selected in response to a first decoder. The gates of the respective field effect transistors are selected in response to a second decoder. A plurality of balanced sense/inhibit line pairs strung through the core array are selectively multiplexed by means of field effect coupling transistors to the inputs of a single sense amplifier, wherein all sense/inhibit lines are initially coupled by means of field effect transistors to the inputs of the sense amplifier. Prior to applying select line currents, all of the balanced sense/inhibit lines except the selected one are turned off in order to minimize coupling of parasitic signals onto the selected sense/inhibit line pair.

22 Claims, 4 Drawing Figures

TO FIG. 1B

FIELD EFFECT TRANSISTOR CORE MEMORY SWITCHING SYSTEM AND METHOD

BACKGROUND OF THE INVENTION

1. Field of the Invention

The invention relates to core memory systems, and particularly to core memory systems utilizing field effect transistors to couple decoding, sensing, and inhibit circuitry to select lines and sense/inhibit lines strung through the core array.

2. Description of the Prior Art

Random access memories composed of high density arrays of toridal ferrite cores have been widely used, both in computer main frame memories and in a wide variety of other applications, especially applications wherein non-volatile memories are required and wherein memories are required to operate at very high and/or low temperatures. As the state of the art has progressed (to the point that extremely high density core arrays containing over half a million bits on a single small card have been achieved), it has become increasingly difficult and expensive to provide electronic addressing circuitry which produces the required "X select" and "Y select" current pulses (having amplitudes of approximately 300 milliamperes) and inhibit currents (which also have current amplitudes of approximately 300 milliamperes) and still maintain satisfactorily high noise margins, low parasitic "line swapping" currents, small physical size, and low power dissipation for the core memory systems.

Accordingly, it is an object of this invention to provide a system and circuitry for addressing, sensing, and restoring or writing information into individual cores of a high density core memory array more reliably and less expensively than circuits and systems of the prior art.

In the past, line driver circuits and line receiver circuits have been utilized to generate the 300 milliampere select line current pulses necessary to accomplish selection in core memory systems. Bi-polar circuits, commonly referred to as matrix switches, have been utilized in conjunction with diodes connected at opposite ends of each select line. Frequently, as many as 16 word lines are connected together of such diodes and decode switches. Parasitic currents flowing from one word line to another when the voltage of the common node varies limit the number of word lines that can be connected together at one end in this fashion. Such parasitic currents are referred to as "line swapping" parasitic currents, and the magnitudes of such line swapping currents increase as the size of the core memory matrix increases. One common technique to overcome these problems is that disclosed in the copending patent application "CIRCUITRY AND METHOD FOR REDUCING PARASITIC COUPLING", Ser. No. 067,811, filed Aug. 20, 1979 now U.S. Pat. No. 4,300,214, assigned to the present Assignee, and incorporated herein by reference. Other schemes for interfacing with core memory arrays are shown in U.S. Pat. Nos. 3,566,375; 3,432,835,; 3,231,753; 3,351,924; 3,343,147; 3,469,249; 3,380,038; 3,540,015; 3,582,911; 3,546,487; and 3,445,831. The necessity for providing large numbers of such diodes has been one factor in increasing the size and cost of modern core memory systems. The large number of line drivers and line receivers has unduly increased the power dissipation thereof.

Accordingly, it is another object of the invention to provide a core memory system which avoids the need for providing steering diodes and isolation diodes at both ends of select lines strung through the core memory array.

Another object of the invention is to provide a core memory system which enables a large number of word lines to be connected together at one end thereof in order to increase the size of a core memory matrix without causing a corresponding increase in the magnitudes of line swapping currents.

In the past, sense/inhibit lines in core memory arrays have been "balanced" lines. Ends of a sense/inhibit conductor are coupled to termination resistors, steering diodes and the inputs of a memory sense amplifier. The entire sense/inhibit conductor is strung through the core array through a large number of memory cores. The mid point of the sense/inhibit conductor is connected to the output of an inhibit driver which produces a 300 milliampere inhibit pulse during a memory restore or write operation. The two equal halves of the sense/inhibit conductor on either side of the midpoint pass through equal numbers of memory cores, and are "balanced" in this sense. Differential sensing can then be accomplished, as is well known. A large number of sense amplifiers are typically required in a core memory system used in a memory having a large number of bits per word.

Therefore, it is another object of the invention to provide a core memory system which requires fewer sense amplifiers and fewer inhibit drivers than known core memory systems.

In at least one instance, field effect transistors have been utilized to multiplex sense lines in a plated wire memory system to the inputs of a single sense amplifier. However, no large inhibit current pulses are required to facilitate writing of "zeros" into individual storage elements. It would be advantageous to be able to multiplex a plurality of sense-inhibit line pairs to the inputs of a single sense amplifier into the outputs of a single inhibit driver if this could be achieved without causing undue parasitic coupling which would add unsatis- factorily long delays to the sensing operation. However, use of multiplexing devices to couple balanced sense line pairs in a core memory system to the inputs of a sense amplifier is very difficult unless perfectly matched multiplexing devices are provided This is because the magnitude of the sensed signal for an accessed memory core is only approximately ten to twenty millivolts. Very small amounts of mismatching in the multiplexing devices would completely overwhelm the sensed signal. Precise matching of field effect transistors large enough to conduct a 300 milliampere inhibit current would be unduly difficult, and the large capacitive gate-to-source and gate-to-drain coupling for such large field effect transistors would result in very large transient voltages being coupled to the input of the sense amplifier, necessitating long settling times before applying select line currents during a read operation. This would greatly increase the read access time. Due to these problems and the sheer size of available field effect transistors, multiplexing of sense signals has not been heretofore implemented in destructive read-out core memory systems.

Accordingly, it is an object of the invention to provide a means of multiplexing sensed signalsin a core memory without the necessity of precise matching of multiplexing devices and without the necessity of substantially increasing read access times of the core memory.

It is another object of the invention to provide a method of operating a core memory system having means for multiplexing sense lines to a single sense amplifier without introducing substantial parasitic noises that require long periods of time to settle on the sense lines.

It is another object of the invention to provide a sense/inhibit line multiplexing system in a core memory array without adding settling times required for parasiticly coupled noises into the memory cycle time.

It is another object of the invention to provide a circuit and method for applying control signals to line selection conductors in a core memory system in such a manner as to minimize the maximum voltage stress to which multiplexing devices are subjected.

It is another object of the invention to provide a core memory circuit and method which facilitates increasing the size of a core memory substantially without causing a corresponding substantial decrease in the signal-to-noise ratio of the core memory system.

It is another object of the invention to provide an improved select line decoding system and method for a core memory system.

SUMMARY OF THE INVENTION

Briefly described, and in accordance with one embodiment thereof, the invention provides a core memory system including an array of cores, a plurality of select lines strung through a plurality of groups of the cores to a common conductor, a plurality of field effect transistors coupled, respectively, to the other ends of the select lines, decoding circuitry for selectively applying a select signal to the gate of a selected one of the field effect transistors and a circuit coupled to that field effect transistor for causing a read select current to flow through the selected field effect transistor during a restore or write cycle to effect accessing of a particular core. In one embodiment of the invention, the decoding circuitry includes circuitry for modulating the levels of voltages applied to the gates of the field effect transistors in accordance with whether the present memory cycle is a read cycle, or a restore or write cycle and also in accordance with whether the field effect transistors are coupled to a selected or unselected select line. The subject voltage levels are modulated in such a manner as to keep the maximum voltage between electrodes of each field effect transistor below a predetermined level. In another embodiment of the invention, the decoding circuitry includes a plurality of transformers each having a primary winding and a plurality of secondary windings Each secondary winding is coupled in series with a corresponding select line and a corresponding field effect transistor. The decoding circuitry decodes an address input to produce select signals for causing a particular transformer to be selected and for causing a particular field effect transistor coupled to the selected transformer to be selected and turned on. A circuit responsive to a read signal controls the direction of a current in a primary winding of the selected transformer causing a read select current to be induced in the secondary winding of the selected transformer that is coupled to the selected field effect transistor, thereby causing the read select current to flow in the selected select line during a read cycle. During a write or restore cycle, a circuit responsive to a write or restore signal causes a current to flow in the opposite direction in a primary winding of the selected transformer, thereby inducing a write select current in the secondary winding of the selected transformer that is coupled to the selected field effect transistor,thereby causing the restore or write select current to flow in the selected select line during a restore or write cycle. In one embodiment of the invention, a plurality of balanced pairs of sense/inhibit lines are strung through the core array and are selectively multiplexed to the inputs of a single sense amplifier by means of a plurality of corresponding pairs of multiplexing field effect transistors that have sufficiently low channel resistance to allow relatively large inhibit currents to be forced through the pairs of sense/inhibit lines by inhibit circuitry during a restore or write cycle. For a read cycle, the field effect transistors are initially all turned on, and then are all turned off except the pair coupling the selected pair of sense/inhibit lines to the inputs of the sense amplifier. A sufficient amount of time is allowed for noise voltages capacitively coupled (during the turning of the unselected multiplexing field effect transistors) onto the inputs of the sense amplifier for the noise voltages to decay before a read select current is forced into the selected select line. A relatively small sense voltage induced in one of the selected sense/inhibit lines then is coupled to the inputs of the sense amplifier by the selected multiplexing transistors. The described embodiments of the invention achieve isolation of unselected select lines from selected select lines without use of isolation diodes and allow use of reduced complexity, reduced power circuitry, including decoding circuitry, current driver circuitry, and inhibit circuitry. The use of fewer and lower power circuit components substantially reduces volume occupied by the core memory system.

BRIEF DESCRIPTION OF THE DRAWINGS

FIG. 4A shows waveforms useful in explaining the operation of the invention shown in FIGS. 1A and 1B.

FIG. 4B shows waveforms useful in explaining the operation of the invention shown in FIG. 3.

FIG. 5 is a schematic diagram of a circuit which can be incorporated with the embodiment of the invention of FIGS. 1A and 1B.

DESCRIPTION OF THE INVENTION

Figure 1A:
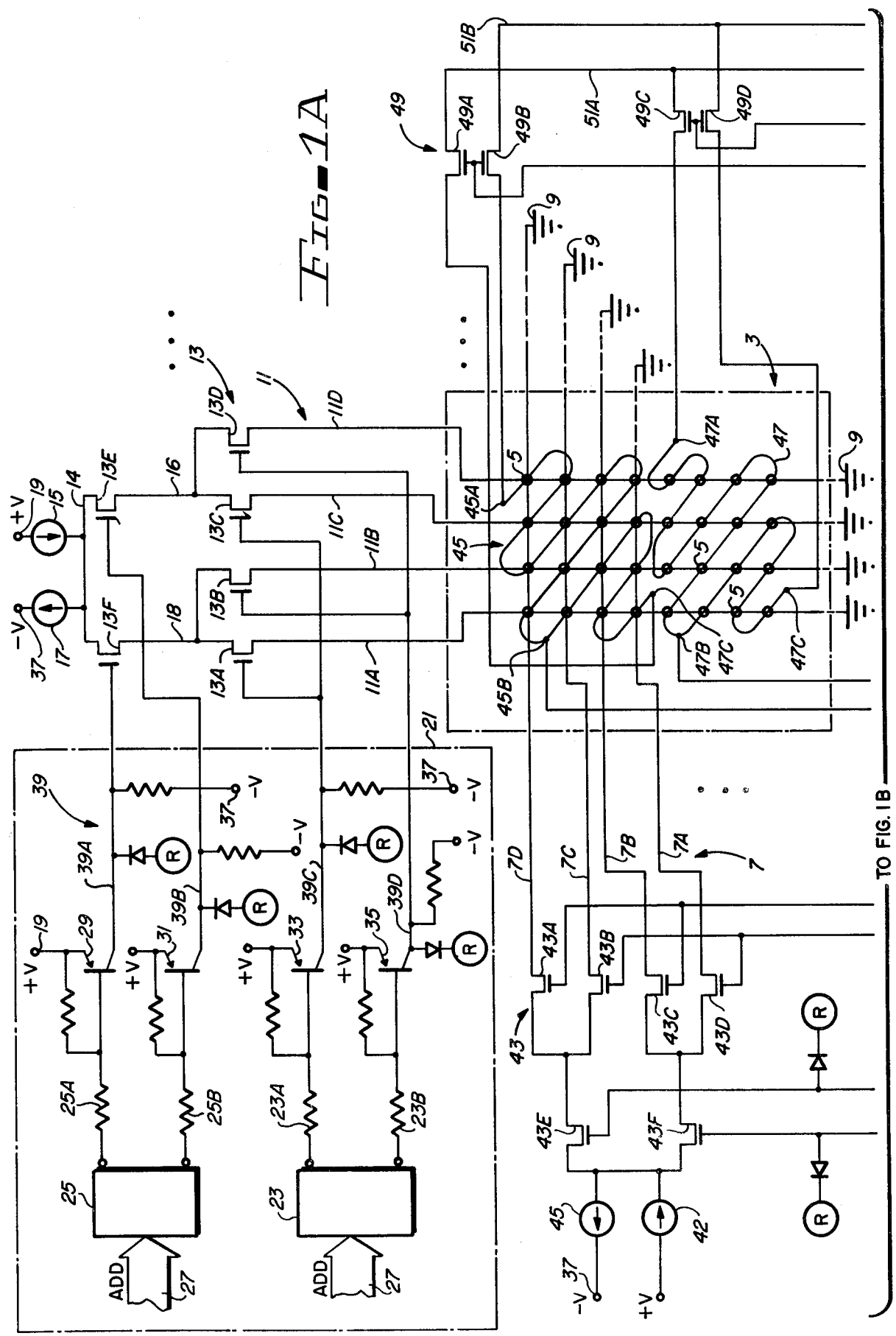
FIGS. 1A and 1B together comprise a schematic diagram of a core memory system according to the present invention.
Figure 1B:
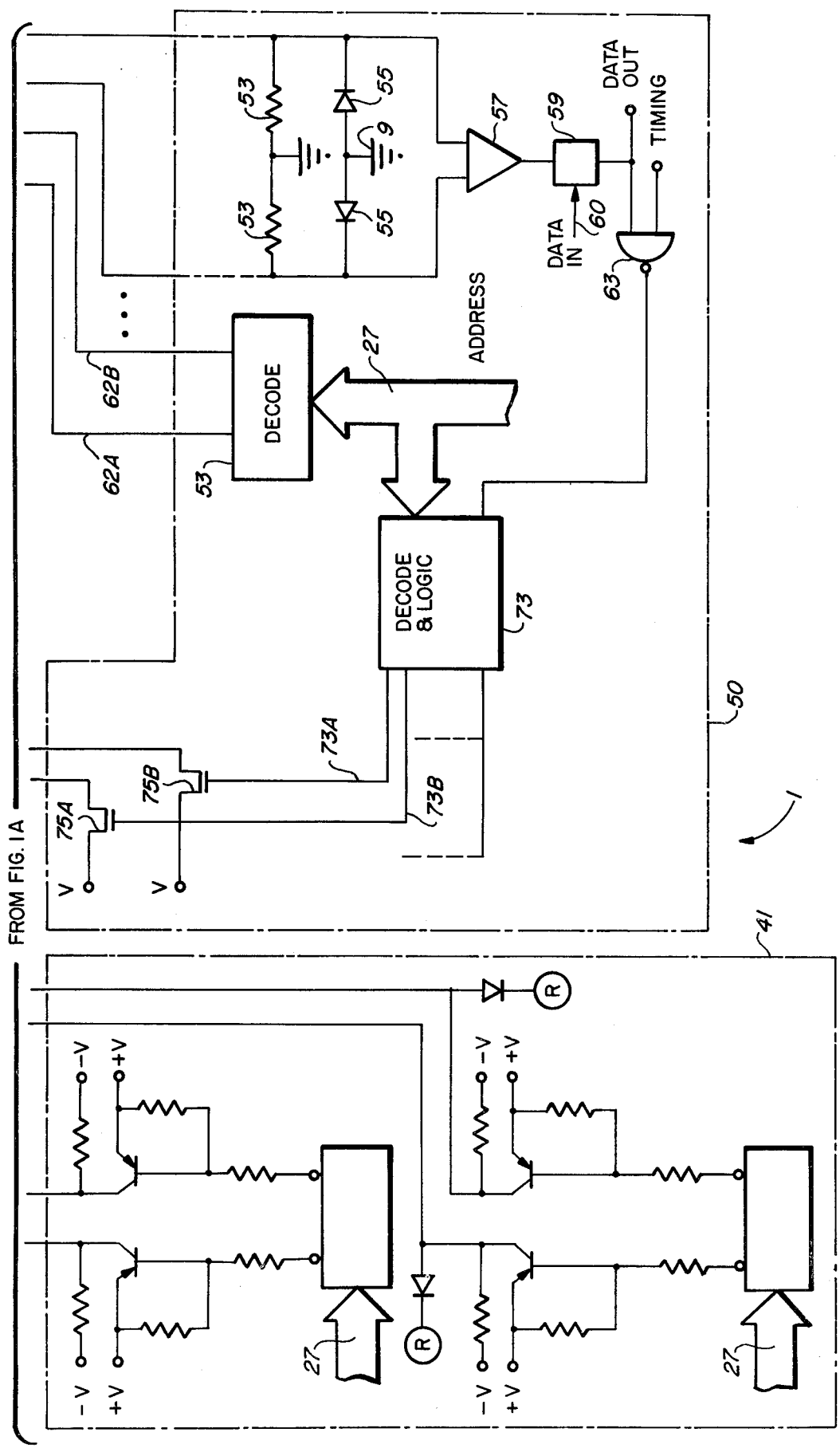

Referring to FIGS. 1A and 1B, which together compose a schematic diagram of one embodiment of the invention, memory system 1 includes a core memory array 3. Core array 3 can, for example, include 65,536 words of 18 bits each. It should be appreciated that only a few cores are shown in FIG. 1A and that the precise manner of illustrating the way in which sense/inhibit lines 45 and 47 pass through respective cores of a "bit" is merely illustrative of the way in which sense/inhibit conductors are passed through cores in an actual core array.

Core array 3 includes a large number of individual toroidal ferrite cores, several of which are designated by reference numeral 5. In FIG. 1A, toroidal cores 5 are arranged in rows and columns. It can be seen that a plurality of conductors 7 referred to herein as "X select" lines, including X select lines 7A, 7B, 7C and 7D, each pass through each of the ferrite cores 5 in a respective one of the four rows of cores shown. There can be, for example, 256 of the X select lines 7. Similarly, a plurality of (for example, 256) Y select conductors 11, including Y select lines 11A, 11B, 11C and 11D, pass through each of the cores 5 in respective ones of the four columns shown. Each of the X select conductors 7 and each of the Y select conductors 11 terminates at a ground conductor 11, designated by reference numeral 9.

A plurality of (i.e., nine) pairs of balanced sense/inhibit conductors are strung through core array 3. Each sense/inhibit conductor has two sections. For example, sense/inhibit conductor 45 has two end points 45A and 47C and a center point 45B. The portion on one side of center point 45A of conductor 45 is referred to as a sense/inhibit line, as is the portion on the other side of center point 45A. Each of the two lateral portions of sense inhibit conductor 45 pass through the same number of cores 5. Thus, the two portions of sense/inhibit line 45 are balanced as closely as possible with respect to resistance, inductance, and capacitance. Similarly, sense/inhibit conductor 47 has end points 47A and 47C and center point 47B. The two balanced sections of sense inhibit conductor 47 also pass through equal numbers of ferrite cores 5 in the same manner as sense/inhibit conductor 45.

End points 45A and 45C are connected, respectively, to the drains of MOS field effect transistors 49B and 49A, respectively. End points 47A and 47C are connected to the drains of MOS field effect transistors 49C and 49D, respectively. Center points 45B, 47B are connected to the sources of MOSFETS 75A and 75B, respectively. It should be appreciated that MOSFETS (metal oxide semiconductor field effect transistors) generally are symmetrical devices, with respect to their sources and drains. For the purpose of describing the structure of the circuitry in FIGS. 1A and 1B, a particular one of the source and drain terminals will be referred to as the source and the other as the drain, even though each of those terminals can play the role of either source or drain, depending upon the mode of operation of the circuit. The term "current conducting electrode" occasionally will be used to refer to both the drain and source electrodes of field effect transistors.

Core memory circuit 1 further includes Y decoder circuit 21 and X decoder circuit 41. Y decoder circuit 21 generates the necessary "gate control signals" to effect selection of one of the X select conductors 11. X decoder circuit 41 generates the necessary gate control signals to effect selection of one of the X select conductors 7.

The control signals on control conductors 39 are applied, respectively, to the gate electrodes of MOSFETS 13A, 13B, 13C, 13D 13E and 13F. MOSFETS 13A-13F are N-channel MOSFETS. Those skilled in the art will know that the one of the two current carrying terminals (i.e., the source and the drain) which is at the higher voltage is the source electrode of that MOSFET. Of course, during circuit operation, one of the two current carrying terminals may function as the source at one time and as the drain at another time.

MOSFETS 13A, 13B, 13C and 13D have their source electrodes connected, respectively, to Y select conductors 11A, 11B, 11C and 11D. MOSFETS 13A, 13B have their drain electrodes connected to conductor 18, and MOSFETS 13C and 13D have their drain electrodes connected to conductor 16. MOSFETS 13E and 13F have their drains connected to conductor 14 and their sources connected to conductors 17 and 16, respectively. A current source circuit 17 functions to deliver a select current of approximately 300 milliamperes out of conductor 14 toward −V conductor 37. This current is a read current. Current source circuit 15 applies a 300 milliampere current pulse from +V conductor 19 into conductor 14 during a restore or write operation.

The gates of MOSFETS 13E and 13F are connected to conductors 39B and 39A, respectively. The gate conductors of MOSFETS 13A and 13C are connected to conductor 39C. The gate conductors of MOSFETS 13B and 13D are connected to conductor 39D.

Conductors 39A, 39B, 39C and 39D are connected to the collectors of PNP transistors 29, 31, 33 and 35, respectively, and are each coupled by means of a resistor to −V conductor 37. The emitters of each of PNP transistors 29, 31, 33 and 35 are connected to +V conductor 19 and are also coupled by means of a resistor to the bases of those respective transistors. The base of transistor 29 is coupled by means of resistor 25A to an output of decoder circuit 25. The base of transistor 31 is coupled by resistor 25B to an output of decoder circuit 25. The base of transistor 33 is connected by resistor 23A to an output of decoder circuit 23, and the bases of transistor 35 is connected by resistor 23B to an output of decoder circuit 23. Address conductors 27 are connected to the respective address inputs of decoder circuits 25 and 27.

The structure of decoding circuitry 41 is essentially identical to that of Y decoding circuitry 21 and will not be repeated although it is shown in detail in FIG. 1B. Select conductor 7, including conductors 7A, 7B, 7C and 7D, are connected, respectively to the same conductors of N-channels MOSFETS 43D, 43C, 43B and 43A, respectively. The respective drains of MOSFETS 43D and 43C are connected to the drain of MOSFET 43F, and the drain of MOSFETS 43B and 43A are connected to the drain of MOSFET 43E. The drains of MOSFETS 43E and 43F are each connected to current sources 45 and 42. Current sources 45 and 42 are connected to −V conductor 19 and +V conductor 37, respectively.

The gates of the MOSFETS coupled to X select conductors 7 are connected in substantially the same manner as is the case for the above-described Y select conductors and the structure will not be recited in further detail, although it is shown in detail in FIG. 1B.

Center tap points 47B and 45B of sense/inhibit conductors 47 and 45, respectively, are connected to the source electrodes of N-channel MOSFETS 75B and 75A, respectively. The drains of both of MOSFETS 75A and 75B are connected to +V conductor 19. The gates of MOSFETS 75A and 75B are connected to conductors 73B and 73A, respectively, which are connected to the respective outputs of decode and logic circuit 73. Decode logic 73 and MOSFETS 75A and 75B are included in inhibit circuitry 50, which also includes decoder circuit 53, two-input NAND gate 63, data register 59, sense amplifier 57, 100 ohm termination resistors 53, and steering diodes 55.

The drains of MOSFETS 49A and 49C are connected to sense line 51A. The drains of MOSFETS 49B and 49D are connected to sense line 51B. Sense lines 51A and 51B are connected to the two inputs of sense amplifier 57, the output of which is connected to data register 59 Termination resistors 53 each have one terminal connected to ground conductor 9 and another terminal connected to sense lines 51A and 51B, respectively. Diodes 55 each have their respective anodes connected to ground conductor 9; the cathode of one is connected to sense line 51A and the cathode of the other is connected to sense line 51B. A timing signal is applied to one input of NAND gate 63, the other input thereof being connected to the output of data register 59. Data may be loaded into data register 59 either by means of a data input conductor 60 or sensed data detected by sense amplifier 57, in which case the sensed data must be restored into the core from which it was read.

The output of NAND gate 63 is connected to decode and logic circuitry 73. Decode and logic circuitry 73 also has a plurality of decode inputs connected to respective ones of address conductors 27. Decoder 53 has its inputs connected to respective ones of address conductors 27. Two of the outputs of decoder circuit 53 are connected to conductors 62A and 62B, respectively. The gate electrodes of MOSFETS 49A and 49B are connected to conductor 62A, and the gate electrodes of MOSFETS 49C and 49D are connected to conductor 62B. It should be understood that the number of X select lines, Y select lines, sense/inhibit lines, and associated circuitry can be expanded within the usual constraints involved in core memory systems.

Figure 2:
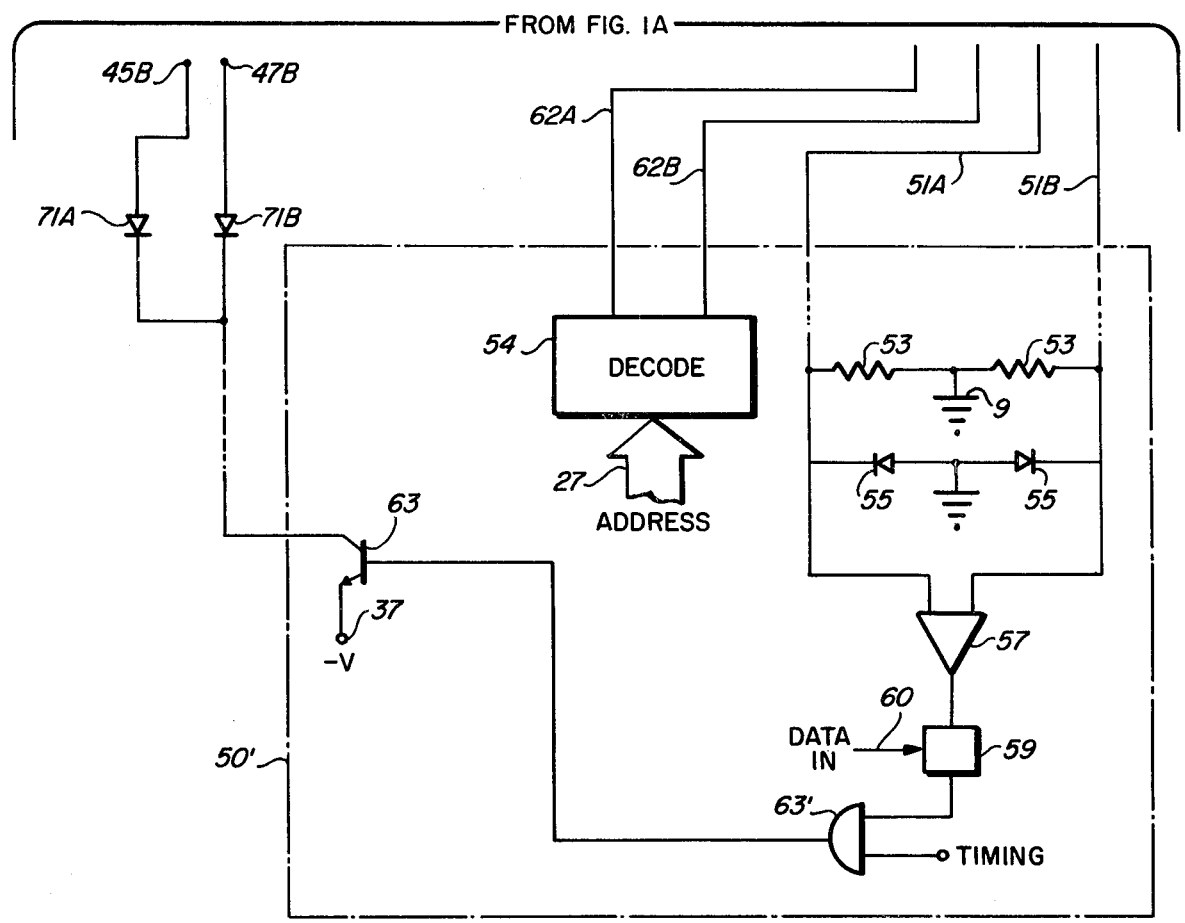
FIG. 2 is a schematic diagram of alternate circuitry which can be utilized in FIG. 1B.

It should be noted that the circuitry shown in block 50 in FIG. 1B can be replaced by simpler inhibit circuitry, shown in block 50' in FIG. 2. Referring now to FIG. 2, center tap 45B of core array 3 is connected to the anode of diode 71A, the cathode of which is connected to the collector of NPN inhibit switch transistor 63. Center point 47B of sense/inhibit conductor 47 is connected to the anode of diode 71B the cathode of which is connected to the collector of NPN transistor 63. The emitter of NPN inhibit switch transistor 63 is connected to −V conductor 37. The base of transistor 63 is connected to the output of AND gate 63'. The connections shown in FIG. 2 for AND gate 63', data in conductor 60, data register 59, sense amplifier 57, address bus 27, and decoder 53 are the same as those shown in block 50 in FIG. 1B and therefore are not repeated.

The decoders represented by blocks 23 and 25 in FIG. 1A can readily be implemented by those skilled in the art, since a wide variety of suitable integrated circuit decoders are available from all major semiconductor manufacturers. For example, Texas Instruments 7445 one-of-ten high voltage decoders can be readily utilized. Similarly, decoders 25' and 25" of FIG. 3 can also be easily implemented in a large variety of ways by those skilled in the art. Similar comments apply to decoders 53 and 73 in FIG. 1B. National Semiconductor MH0007DC coupled clock drivers are useful in implementation of the decoder circuits 53 and 73 in FIG. 1B. Current source circuits 15 and 42 in FIG. 1A can be implemented by means of various well known circuitry. Similarly, current source circuits 17 and 45 can be readily implemented by means of various well known circuitry. The gate control select conductors such as 39A, 39B, 39C etc. in FIG. 1A can be terminated through high resistance resistors to the negative power supply and suitable circuitry can be provided to charge the points labeled R in FIGS. 1A and 1B to within one collector-to-emitter saturation voltage of −V volts.

Figure 3:
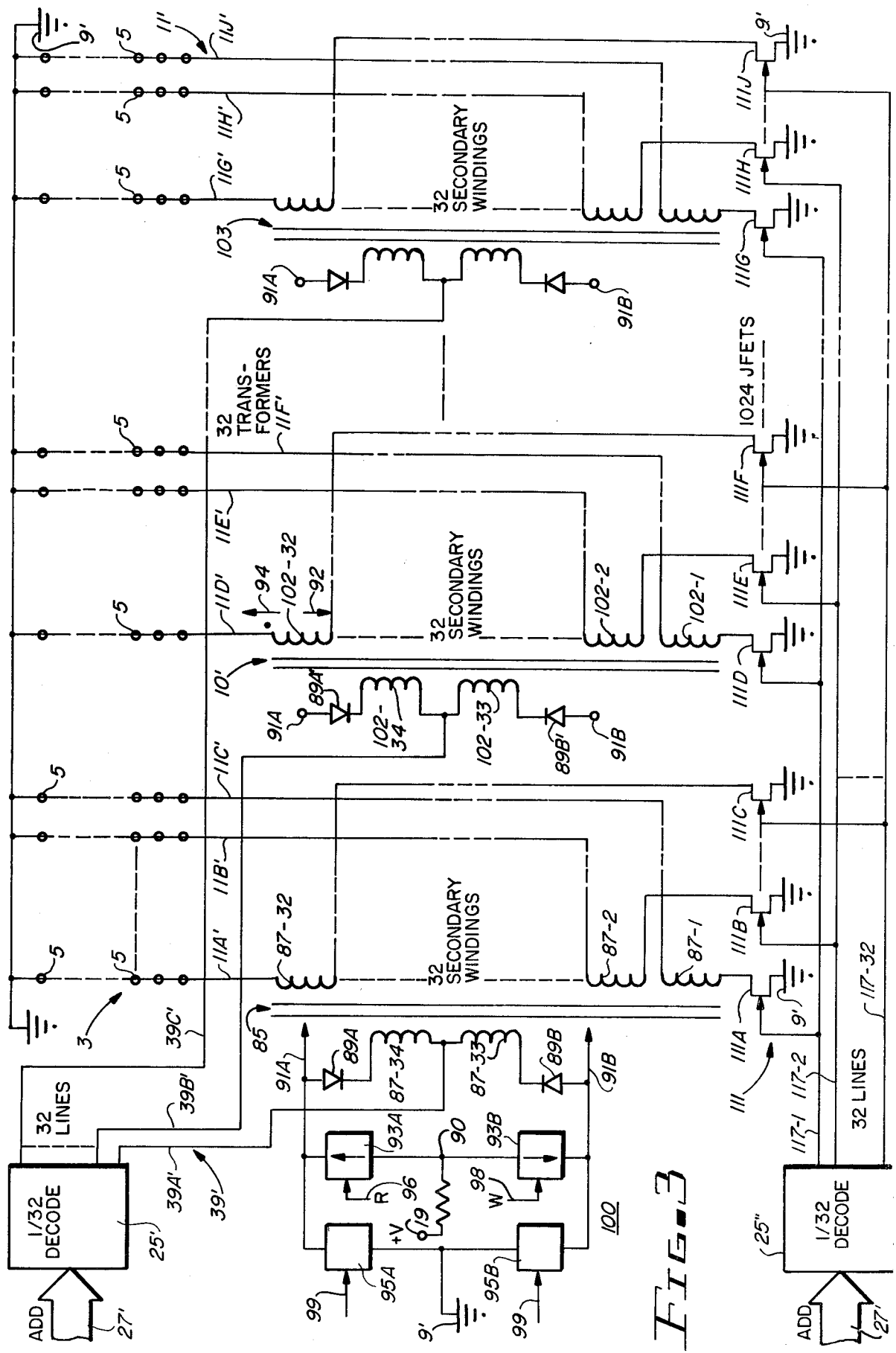
FIG. 3 is a schematic diagram of a field effect transistor/transformer word line decoding system in accordance with another embodiment of the present invention.

Referring now to FIG. 3, an alternate type of word select line scheme to that shown in FIGS. 1A and 1B is illustrated. Referring to FIG. 3, select line decoding circuit system 100 includes two "one-of-thirty-two" decoders 25' and 25", each having address inputs connected to various conductors of address bus 27'. Decoder 25' has 32 output lines, including lines 39A' 39B' and 39C'. Select line decoding circuit 100 also includes 32 transformers, including transformers 85, 101, and 103. Each of these transofrmers includes 34 windings, of which two are primary windings and 32 are secondary windings. For example, transformer 85 includes secondary windings 87-1, 87-2, . . . 87-32 and also includes primary windings 87-33 and 87-34.

Primary windings 87-33 and 87-34 are connected in series between the cathodes of steering diodes 89A and 89B. The anode of diode 89A is connected to conductor 91A, and the anode of diode 89B is connected to conductor 91B.

A controlled current source circuit 93A is connected between conductor 91A and conductor 90. Controlled current source 93B is connected between conductor 91B and conductor 90. Conductor 90 is conected by means of a resistor to +V conductor 19'. A read control signal R applied to conductor 96 is provided as an input to controlled current circuit 93A and a write signal W is applied to conductor 98 and provided as an input to controlled current source 93B.

Two shunt circuits 95A and 95B are coupled between ground conductor 9' and conductors 91A and 91B respectively. A signal applied to conductor 99 can be provided as an input to shunt circuits 95A and 95B in order to short conductors 91A and 91B to ground, if it is ever necessary to suddenly deactivate all of the circuitry in select line circuit 100.

Core memory array 3 in FIG. 3 includes a large number of ferrite cores 5, arranged in rows and columns, as previously discussed in reference to FIGS. 1A and 1B. Where convenient, the same reference numerals are used in FIG. 3 as in FIGS. 1A and 1B to designate similar parts. In FIG. 3, select lines 11A', 11B', 11C', 11D', 11E', 11F', 11G', 11H', and 11J' are included in a group of 1024 word select lines collectively designated by reference numeral 11'. Each of those select lines is passed through all of the ferrite cores 5 included in a particular column shown in FIG. 3.

Thirty-two of the select lines 11' including 11A', 11B', and 11C', are connected to corresponding "dotted" secondary winding terminals of the 32 secondary windings of transformer 85. For example, word line conductors 11A', 11B', and 11C' are each coupled to a corresponding terminal of secondary windings 87-32, 87-2 and 87-1. Similarly, select line conductors 11D', 11E', and 11F' are connected to corresponding dotted secondary winding terminals of secondary windings 102-32, 102-2 and 102-1, respectively, of second transformer 101. The secondary winding dotted terminals of transformer 103 are similarly connected to corresponding respective ones of the last 32 word line conductors.

The undotted terminals of each of the secondary windings of transformer 85 are connected to respective ones of the drain electrodes of JFETS (junction field effect transistors) 11A, 11B, and 11C. The source electrodes of JFETS 111A, 111B, and 111C are connected to ground conductor 9'.

In FIG. 3, reference numeral 111 designates 1024 JFETS that are arranged in 32 groups of 32 JFETS each. The drains of the respective JFETS in each group of 32 are respectively connected to corresponding ones of the other undotted terminals of the secondary windings of transformer 85. In the second group of 32 JFETS, the drains of JFETS 111D, 111E and 111F are connected to the undotted terminals of secondary windings 102-1, 102-2, . . . 102-32. In the last group of 32 JFETS, the drains of JFETS 111G, 111H, and 111J are respectively connected to corresponding undotted terminals of the secondary winding of transformer 103, as shown in FIG. 3.

The respective gate electrodes of JFETS 111 are connected by means of signals applied to various ones of a group of 32 conductors, including 117-1, 117-2 . . . 117-32, which are connected to the outputs of decoder 25". For example, conductor 117-1 is connected to the first JFET of each of the above-mentioned 32 groups of 32 JFETS each. More specifically, conductor 117-1 is connected to the gate electrode of JFETS 111A, 111D, . . . 111G. Similarly, conductor 117-2 is connected to the second JFET in each of the above-mentioned 32 groups of JFETS, including JFETS 111B, 111E and 111H. The last of the 32 conductors, namely 117-32, is connected to the last JFET in each of the 32 groups, including the gates of JFETS 111C, 111F, and 111J.

It should be appreciated that two decoding systems such as the one shown in FIG. 3 can be utilized in a core array to accomplish X-Y selection. For example, the select lines 11' in FIG. 3 could include the X select lines in a coincident current selection addressing scheme, and another circuit similar to that shown in FIG. 3 could be utilized to generate select currents for the Y select lines of the coincident current selection addressing scheme.

A decoding circuit suitable for "modulating" the gate select voltages applied to the gate electrodes of transistors such as 13 in FIG. 1A is shown in FIG. 5. However the description of its structure will be more meaningful after the following discussion of the operation of the embodiments of the invention shown in FIGS. 1A and 1B in FIG. 3 is read.

In operation, core memory system 1 of FIGS. 1A and 1B receives a particular address representing the location of a particular core in core array 3 from address bus 27. That address is decoded by low power decoders 23 and 25, resulting in turning on of particular ones of the PNP transistors and applying a +25 volt level to the gate electrodes of certain ones of the field effect transistors 13 connected to the select lines 11. A −25 volt level is applied to the gates of the ones of MOSFETS 13 which are to remain off. For purposes of illustration, assume that Y select line 11A is to be selected. Then, +25 volts is applied by transistors 29 and 33 on conductors 39A and 39C, turning on MOSFETS 13F and 13A, respectively. It should be noted that the threshold voltage for the above mentioned MOSFETS is approximately 1 volt, and their resistance is approximately 5 ohms when their gate-to-source voltage is 5 volts. At this point, it is assumed that current source circuits 15 and 17 are both off, and that the voltage on conductor 14 is zero volts. It should be understood that the current source symbols for current sources 15 and 17 represent circuits that in effect selectively connect conductor 14 to either +20 volts or −20 volts, causing currents to flow in the selected Y select line in the directions indicated by the arrows shown in controlled current sources 15 and 17, respectively. It should also be noted that for a Y conductor that extends through 4,608 cores, the Y line resistance is approximately 15 ohms.

FIG. 4A includes waveforms 119, 121, 123, and 125. Waveform 119 represents the voltage applied to conductor 14 in FIG. 1A as a result of turning current source 15 on after the appropriate one of MOSFETS 13 have been turned on by decoding circuitry 23 and 25 to select the desired select line. The resulting voltage appearing on the selected select line has an appearance similar to that of waveform 121, because the large inductance (typically 3 to 4 microhenries) of the selected select line causes the voltage to rise sharply to +20 volts as the 300 milliampere current is forced through the selected line. The 20 volt peak decays (at a rate determined by a time constant equal to the select line inductance divided by its distributed resistance) to approximately 7 volts. Waveform 123 represents the voltage on conductor 14 if current source 17 is turned on after the selected ones of field effect transistors 13 have been turned The resulting voltage on the selected select line has the appearance of waveform 125 in FIG. 4A, wherein the voltage falls rapidly to −20 volts, due to the large select line inductance, and then settles to approximately −7 volts, as shown.

From a practical point of view, it has been found desirable to maintain a negative gate-to-source voltage for N-channel MOSFETS 13 of at least 5 volts to be certain that no small "spikes" or overshoot voltages applied to their gate electrodes result in inadvertant turning on of a MOSFET that is supposed to be off. For the waveforms shown in FIG. 4A, a positive gate voltage of +25 volts will ensure that any of MOSFETS 13 will be turned on and have a channel resistance of 5 ohms or less.

It can be seen, for the above hypothetical example, that during a read operation, MOSFET 13F has +20 volts on its drain and since its resistance is only 5 ohms, nearly the same voltage (+20 volts) on its source. This results in the +5 volt overdrive needed to produce the desired 5 ohm resistance for MOSFET 13F. MOSFET 13A, which also is in its "on" condition, has +25 volts applied to its gate and +20 volts on its source and drain. However, MOSFETS 13E, 13D and 13B all have −25 volts applied to their gate electrodes, but +20 volts applied to their sources. This results in a 45 volt difference between their gates and their current carrying electrodes. It would be highly desirable to reduce the magnitude of this voltage difference so that lower cost MOSFETS can be used with a high expectation of reliable operation. Similarly, in the write or restore operation, if we again assume that MOSFETS 13F, 13A, and 13C are on, those MOSFETS have +25 volts applied to their respective gates and −20 volts on their respective drains and sources. Therefore, there is a 45 volt difference between the gate voltage and the source and drain voltages of the MOSFETS which are turned on during a write or restore operation. During the write or restore operation, the MOSFETS which are turned off, namely MOSFETS 13E, 13B and 13D in the above example, have minus 25 volts applied to their sources and drains. Thus, there is only a 5 volt difference between the gate voltage and the source and drain voltages.

In order to avoid the above-mentioned 45 volt differences between gate electrodes and the current conducting electrodes (sources and drains) of the MOSFETS during operation, it is advantageous to provide decoding circuitry which "modulates" the voltages applied to conductors 39A, 39B, 39C, and 39D. In accordance with the present invention, a circuit (shown in FIG. 5, described subsequently) is provided which causes the voltage on the gate control conductors to be +25 volts if the MOSFET is to be turned on during a read operation and −5 volts if the MOSFET is to be turned off during a read operation. The same circuit causes the voltage applied to the gate control conductors to be +5 volts if the MOSFET is to be turned on during a restore or write cycle and to be −25 volts if the MOSFET is to be turned off during a restore or write operation.

Various circuits can be designed for implementing the desired modulated gate control voltages, and the one shown in FIG. 5 is merely illustrative. In FIG. 5, AND gate 137 performs the necessary decoding function to select which of the MOSFETS must be turned on to couple a particular select line to the desired 300 milliampere select current source. Reference numeral 113' represents such a MOSFET. MOSFETS 139, 141, 143, and 145 all have their respective source electrodes connected to the gate of MOSFET 113' and have their drain electrodes connected, respectively, to +25 volt, −5 volt, +5 volt, and −25 volts supply voltage lines.

The gates of MOSFETS 139, 141, 143, and 145 are connected, respectively, to the outputs of AND gates 147, 149, 151, and 153. The output of AND gates 137 is connected to one input of each of AND gates 147 and 151. The level on the output of AND gate 137 is applied to the inputs of AND gates 149 and 153. A read signal is applied to the other inputs of AND gates 147 and 149. A write/restore signal is applied to the other input of AND gates 151 and 153.

For a read cycle, the circuit of FIG. 5 produces a +25 volt voltage on the gate of select transistor 113' if transistor 113' is connected to a "selected" select line and a −5 volt level if transistor 113' is connected to an "unselected" select line. For a write or restore memory operation, the circuit of FIG. 5 produces a +5 volt level on the gate of transistor 113' if transistor 113' is connected to a selected select line and produces a −25 volt level on the gate of transistor 113' if transistor 113' is connected to an unselected select line.

It can be seen that the above-described circuitry of FIGS. 1A and 1B for selecting the desired Y select line completely isolates the unselected ones of Y select lines 11 from the select line driver comprising current sources 15 and 17. Either a positive or negative 300 milliamp pulse is produced in the selected line, depending upon whether the present operation is a read operation or a write/restore operation. The desired operation of the select lines 11 (and 7) has therefore been accomplished without the need for the above-mentioned 2 or 4 diodes per select line. This has the effect of substantially reducing both the cost and physical size of core memory system 1. The number of and complexity of line driver and line receiver circuits has also been reduced over prior core memory systems, and the power dissipation has therefore also been reduced.

It should be appreciated that the circuitry and method of operation for the X decoder 41 and the X select MOSFETS 43 and select line drivers 42 and 45 is identical to that described above, and therefore need not be repeated.

During a read operation, the address on address bus 27 is decoded by decoder 53 to effect multiplexing of the selected sense-inhibit line pair onto conductors 51A and 51B. In accordance with the present invention, all of the multiplexing MOSFETS, including 49A, 49B, 49C, 49D, etc. initially are turned on by applying +5 volt gate control signals to conductors 62A, 62B, etc.

Then, before the above mentioned read select currents are applied to the selected X select line and Y select line, all of the senseinhibit line multiplexing FETS are turned off except the two FETS (i.e., the selected pair) coupling the selected sense/inhibit line pair to the inputs of sense amplifier 57. The capacitive gate-to-source and gate-to-drain parasitic voltage coupled between the gates of the multiplexing MOSFETS turned off (i.e., the unselected MOSFETS), causes a relatively large perturbation on lines 51A and 51B, but this settles out rapidly, typically in less than 100 nanoseconds, due to the action of termination resistors 53. The capacitive coupling from the gates of the multiplexing transistors in the off condition onto the sense/inhibit line pairs isolated from the inputs of sense amplifier 57 does not settle out rapidly, but this does not matter, since these sense/inhibit line pairs are not then electrically coupled to the input of sense amplifier 57, and the comparatively large parasitic voltage coupled onto these lines will not obscure the minute sense voltage induced by the selected core onto the selected sense/inhibit line. As soon as the above-mentioned perturbation on lines 51A and 51B settles out, the read select pulses can be applied to the X select line and Y select line passing through the selected core in the manner previously described. The resulting sensed voltage is typically approximately 15 millivolts and passes through the low (approximately 5 ohm) resistance of multiplexing MOSFETS 49A and 49B (assuming that they correspond to the selected sense line thereby coupling the 15 millivolts sensed signal to the inputs of sense amplifier 57.

The amplified output of sense amplifier 57 is utilized to load the destructively read out state of the selected core into data register 59. A timing pulse applied to one input of NAND gate 63 gates the previously sensed state into an input of decode and logic circuit 73, which selects the appropriate one of conductors 73A, 73B, etc., coupling the center tap 45B, 47B, etc. of the selected sense/inhibit line pair to −V, which is typically 25 volts. This causes an inhibit current to flow through the selected core if a "zero" was initially stored in it and read lg 1 out during the previously described sensing operation, thereby causing a "zero" to remain in the selected core. If a logical "one" was stored in the core, no inhibit current is forced through that core, causing a "one" to be written therein as a consequence of coincidence of the two native 300 milliampere X and Y select currents passing through the selected bit. Thus, in accordance with the present invention, the exceedingly small sensed voltage is multiplexed from the senseinhibit line pair passing through the selected core to the inputs of the sense amplifier by means of suitable pairs of multiplexing MOSFETS, and the large 300 milliampere inhibit current is also multiplexed onto the selected sense/inhibit line pair during either the write operation or restore operation. In the event that the present operation is a write operation, data is loaded into register 59 by means of data input conductor 60, rather than from the output of sense amplifier 57. It should be noted that no diodes or termination resistors are required at either end of the sense/inhibit line pairs for the described sensing and inhibiting circuitry.

However, if the circuitry shown in block 50 of FIG. 1 is replaced by that shown in block 50' of FIG. 2, the operation is quite similar, except that during the write or inhibit operations, the output of AND gate 63' simply turns NPN transistor 63 on or off, depending upon whether a logical "one" or a logical "zero" is stored in register 59. If NPN transistor 63' is turned on, the cathode of diodes 71A, 71B, etc. are charged to approximately −V volts. The output of decoder 53 causes the multiplexing transistors 49A and 49B to be turned on for the selected sense/inhibit line pair, and causes the multiplexing transistors for all unselected sense/inhibit line pairs turned off. Accordingly, current will flow from −V supply conductor 37 through NPN transistor 63' and the one of diodes 71A, 71B, etc. through the selected sense/inhibit line pair and through MOSFETS 49A and 49B. Diodes 71A and 71B then perform an isolation function which prevents the sense/inhibit line pairs passing through the selected bit from being loaded down by the inhibit circuitry, at the cost of only one diode per sense/inhibit line pair.

It should be noted that in the above described select line circuitry and operation, if junction field effect transistors (i.e., JFETS) are utilized, the "modulation" of the gate control voltages must be more carefully controlled than is the case if MOSFET select line switches are used, because it is necessary to avoid forward biasing of the gate-source and gate-drain voltages of the JFETS under all circumstances. Otherwise, the stored charge of the JFETS resulting if their junctions become forward biased acts as a large capacitance shorting the inputs of sense amplifier 57 together, in effect. To avoid the need for precise modulating of the control voltages applied to the switching field effect transistors when JFETS are used, the circuit of FIG. 3 is utilized to generate select line voltages, wherein both transformer decoding and JFET decoding are utilized.

Next, the operation of the combined JFET transformer line select circuit will be explained. For the purpose of the following description of the operation of the line select circuit of FIG. 3, it is convenient to assume that the address provided on address bus 27' corresponds to select line 11D'. If the memory cycle is a read cycle, a current of 300 milliamperes must be forced into select line 11D' in the direction indicated by arrow 94 by secondary winding 102-32 of transformer 101. The first step in the operation is to turn on JFET 111F in order to allow current to flow through secondary winding 102-32. Note that it is assumed that all of JFETS 111 initially are off, and are held off by −30 volt levels maintained on each of conductors 117-1, 117-2 ... 117-32 by decoder 25''. A voltage having the characteristics shown in waveform 127 of FIG. 4B is applied to conductor 117-32 by decoder 25''. This turns on JFET 111F, producing a 5 ohm resistance between ground and the undotted terminal of secondary winding 102-32. Next, waveform 129 of FIG. 4B is applied to conductor 39B' by decoders 25', applying this voltage to the center tap of the primary windings of transformer 101. A read control signal is applied to conductor 96, causing the current of current source circuit 93A to flow through conductor 91A and steering diode 89A'. This results in waveform 131 of FIG. 4B appearing on conductor 91A. The magnitude of this current is 300 milliamperes, assuming that the primary and secondary windings have the same number of turns in each of the transformers shown in FIG. 3. This causes a 300 milliamp current to flow in secondary winding 102-32 in the direction indicated by arrow 94, thereby "selecting" select line 11D' for a read operation and producing the positive pulse of waveform 135 of FIG. 4B.

The operation for a write or restore operation is identical to that described above, except that a write signal is applied to conductor 98, causing current source circuit 93B to generate a 300 milliampere current that flows through steering diode 89B' into primary winding 102-33. This causes the waveform 133 to appear on conductor 91B, and results in inducing a 300 milliampere current through secondary winding 102-32 in the direction indicated by arrow 92, thereby producing a write or restore select pulse in select line 11D' and providing the negative pulse of waveform 135.

It should be noted that during a read operation, thirty-two of JFETS 111 will be turned on by the zero volts applied to conductor 117-32 by decoder 25''. All of the other ones of JFETS 111 are off, because of −30 volt voltages applied to the other outputs of decoder 25''. It should also be noted that an induced voltage having a waveshape different than that of waveform 131 in FIG. 4B will appear on each of the other select lines 11' of transformer 101. The dotted end of each of the "unselected" secondary windings 102-1, 102-2 ... 102-31 of transformer 101 will have a voltage of +20 volts induced thereon. The 50 volt difference between this positive 20 volts and the −30 volts applied to the gates of the unselected ones of the JFETS is undesirably high. As previously mentioned, it would be desirable to reduce such high voltage differences by "modulating" the voltages produced on the ones of the conductors 117-1, 117-2 etc. connected to the gates of unselected JFETS during a read operation. For example, if −10 volts were applied to the gates of the unselected JFETS instead of the −30 volts previously mentioned, then there would only be a 30 volt difference between the gate and drain voltages of each unselected JFET, well within the tolerance of typical commercially available JFETS. Furthermore, the technique of modulating the gate control voltages becomes more significant if the size of the core memory is increased substantially, so that the length of the select lines are increased, increasing the voltage drops thereacross necessary to attain the needed 300 milliampere select currents. This would require larger magnitudes of gate control voltages to effect the above-described pperation, and it would become even more necessary to modulate the gate select voltages in order to minimize the maximum voltages applied between various terminals of each JFET.

The foregoing techniques will enable a four megabit core memory to be packaged in a very small volume of approximately 1500 cubic inches, compared with an estimated 7500 cubic inches which would be required for prior state of the art memories at the present state of the art. The four megabit core memory can be produced such that it will have only approximately thirty watts of dissipation. This performance represents approximately a 5 to 1 reduction in the size of the memory, and a 10 to 1 reduction in the power dissipation could be obtained prior to the present invention.

The previously mentioned multiplexing technique for multiplexing sense signals on sense/inhibit lines to a single sense amplifier allows decoding of sense/inhibit lines, so that in instances wherein prior techniques would require a very long sense/inhibit line, the multiplexing technique allows the very long sense inhibit line to be broken up into a number of shorter sections which then are selectively multiplexed to the input of the sense amplifier. This allows the desired signal-to-noise ratio of the core memory system to be maintained even though the apparent number of bits per word for the core memory system is very large.

While the invention has been described with reference to several particular embodiments thereof, those skilled in the art will be able to make various modifications to the disclosed structure and method of operating without departing from the true spirit and scope of the invention.

We claim:

1. A core memory system comprising in combination:
   (a) an array of memory cores, including a plurality of groups of said memory cores;
   (b) a plurality of select lines, each extending through each memory core of a respective one of said groups, each of said select lines having a first end and a second end, each of said second ends being coupled to a first conductor;
   (c) a plurality of field effect transistors each having a gate electrode and first and second current conducting electrodes, the first current conducting electrode of each of said field effect transistors being coupled to the first end of a respective ones of said select lines;
   (d) first current driving means coupled to the second current conducting electrodes of said field effect transistors for controllably forcing a first select current through a selected one of said field effect transistors and into the one of said select lines coupled to the first current conducting electrode of said selected field effect transistor during a first type of memory cycle;
   (e) second current driving means coupled to the second current conducting electrodes of said field effect transistors for controllably forcing a second select current through said selected one of said field effect transistors and out of said one of said select lines coupled to the first current conducting electrode of said selected field effect transistor during a second type of memory cycle; and
   (f) selection means responsive to a digital address signal for producing a plurality of gate control signals to control the respective gate electrodes of said plurality of field effect transistors, one of said gate control signals being applied to the gate electrode of said selected one of said field effect transistors and turning said selected field effect transistor on, others of said gate control signals being applied to the gate electrodes of others of said field effect transistors to maintain said others of said field effect transistors in an off condition, said digital address signal representing the one of said select lines coupled to the first current conducting electrode of said selected field effect transistor,
   wherein said first type of memory cycle is a read cycle and said first select current is a read select current, and wherein said second type of memory cycle is a restore or write cycle and said second select current is a restore or write select current, and wherein said selection means includes gate control signal modulating means for
   (i) causing said one of said gate control signals to have a first level during a read memory cycle,
   (ii) causing said one of said gate control signals to have a second level during a restore or write memory cycle,
   (iii) causing said others of gate control signals to have a third level during a read memory cycle, and
   (iv) causing said others of said gate control signals to have a fourth level during a restore or write memory cycle.

2. The core memory system of claim 1 wherein said field effect transistors are MOS field effect transistors.

3. The core memory system of claim 1 wherein said plurality of select lines are X select lines, and wherein said memory system also includes a plurality of Y select lines and circuitry that is substantially similar to the circuitry including said plurality of field effect transistors, said first and second current driving means and said selection means coupled to said Y select lines to effect coincident current selection of a particular one of said memory cores.

4. The core memory system of claim 1, said second level being less than said first level, said third level being less than said second level, and said fourth level being less than said third level.

5. The core memory system of claim 1 wherein said first level is sufficiently great, but no greater than is necessary, to maintain said selected field effect transistor in an on condition when said read select current is flowing through said selected field effect transistor, said second level is sufficiently great, but no greater than is necessary, to maintain said selected field effect transistor in an on condition when said restore or write select current is flowing through said selected field effect transistor.

6. The core memory system of claim 1 wherein said third level is sufficiently low, but no lower than is necessary, to maintain said others of field effect transistors in an off condition during a read memory cycle, and wherein said fourth level is sufficiently low, but not lower than is necessary, to maintain said others of said field effect transistors in an off condition during a restore or write memory cycle.

7. The core memory system of claim 1 wherein said selection means includes decoder means responsive to said address signal for decoding said address signal and voltage level translation means responsive to said decoder means for producing said gate control signals.

8. The core memory system of claim 1 wherein said memory cores are arranged as first number of words by a second number of bits, said core memory system further including:
   (a) a plurality of pairs of balanced sense/inhibit lines each passing through a plurality of memory cores of a plurality of groups of said memory cores, respectively, each of said sense/inhibit lines corresponding to a respective one of said bits;
   (b) sense amplifying means for amplifying a sense signal produced by an accessed one of said memory cores, said sense amplifying means having a pair of inputs;
   (c) first multiplexing means for selectively coupling said plurality of pairs of balanced sense/inhibit lines to said inputs of said sense amplifying means to conduct said sense signal from a selected one of said sense/inhibit lines to said inputs of said sense amplifying means while isolating said inputs of said sense amplifying means from other unselected ones of said sense/inhibit lines; and
   (d) inhibit driver means for producing an inhibit current in said selected one of said sense/inhibit lines during a restore or write memory cycle, said inhibit current being substantially greater than said sense signal.

9. A core memory system comprising in combination:
   (a) an array of memory cores, including a plurality of groups of said memory cores;

(b) a plurality of pairs of balanced sense/inhibit lines each passing through a plurality of memory cores of a plurality of groups of said memory cores, respectively, each of said sense/inhibit lines corresponding to a respective one of said bits;

(c) sense amplifying means for amplifying a sense signal produced by an accessed one of said memory cores, said sense amplifying means having a pair of inputs;

(d) first multiplexing means for selectively coupling said plurality of pairs of balanced sense/inhibit lines to said inputs of said sense amplifying means to conduct said sense signal from a selected one of said sense/inhibit lines to said inputs of said sense amplifying means while isolating said inputs of said sense amplifying means from other unselected ones of said sense/inhibit lines; and (e) inhibit driver means for producing an inhibit current in said selected one of said sense/inhibit lines during a restore or write memory cycle, said inhibit current being substantially greater than said sense signal, wherein said first multiplexing means includes a plurality of multiplexing field effect transistors coupled between respective ones of said inputs of said sense amplifying means and respective ones of said sense-inhibit lines, and wherein said multiplexing means maintains all of said plurality of multiplexing field effect transistors in an on condition and then turns off all of said multiplexing field effect transistors except those coupled to said selected one of said pairs of sense/inhibit lines prior to said forcing of said first select current.

10. The core memory system of claim 9 including resistive terminating means coupled to said inputs of said sense amplifying means for effecting decaying of positive voltages on said inputs, said forcing of said first select current occurring after parasitic voltages coupled to said inputs of said sense amplifying means as a result of said turning off have decayed due to said resistive terminating means.

11. The core memory system of claim 9 wherein said field effect transistors are junction field effect transistors.

12. The core memory system of claim 10 wherein said first multiplexing means includes decoding means responsive to said address signal for producing signals to maintain said selected multiplexing field effect transistors in an on condition and then turning off all of said multiplexing field effect transistors except said ones of said multiplexing field effect transistors coupled to said selected pair of sense/inhibit lines.

13. The core memory system of claim 9 wherein each of said pairs of balanced sense/inhibit lines has a center tap point, said core memory system further including means coupled between said inhibit driver means and said plurality of center tap points for isolating said pairs of sense/inhibit lines from said inhibit driver means during a read memory cycle and conducting said inhibit current from said inhibit driver means to said selected pair of sense/inhibit lines during a restore or write memory cycle.

14. The core memory system of claim 13 wherein said isolating and conducting means includes a plurality of diodes having their cathodes coupled to respective ones of said center tap points and having their anodes coupled to an output of said inhibit driver means.

15. The core memory system of claim 13 wherein said isolating and conducting means includes a plurality of isolating and coupling field effect transistors each having a gate electrode and first and second current conducting electrodes, said first current conducting electrodes of each of said isolating and coupling field effect transistors being coupled to a second supply voltage conductor, the second current conducting electrode of each of said isolating and coupling field effect transistors being coupled to a respective one of said center tap points, said gate electrodes of each of said isolating and coupling field effect transistors being coupled to said inhibit driver means.

16. The core memory system of claim 15 wherein said inhibit driver means includes first decoding means responsive to said address signal for selecting one of said isolating and coupling field effect transistors and producing signals for maintaining said selected isolating and coupling field effect transistor in an on condition during a restore or write memory cycle, maintaining others of said isolating and coupling field effect transistors in an off condition during a restore or write memory cycle, and maintaining said selected isolating and coupling field effect transistor off during a read memory cycle.

17. A core memory system comprising in combination:

(a) an array of memory cores, including a plurality of groups of said memory cores;

(b) a plurality of select lines, each extending through each memory core of a respective one of said groups, each of said select lines having a first end and a second end, each of said second end being coupled to a first supply voltage conductor;

(c) a plurality of field effect transistors each having a gate electrode and first and second current conducting electrodes, the first current conducting electrode of each of said field effect transistors being coupled to a second supply voltage conductor;

(d) a plurality of transformers, each having a plurality of secondary windings and two primary windings, each of said primary and secondary windings having first and second terminals, said second terminal of said first primary winding being coupled to said first terminal of said second primary windings, said first terminals of said secondary windings being coupled to said first ends of respective ones of said select lines, said second terminals of said secondary windings being coupled to said second current conducting electrodes of respective ones of said field effect transistors;

(e) first decoding means having a first group of output conductors and responsive to a digital address signal for producing a transformer selection signal on a one of said output conductors determined by said digital address signal, said output conductors being coupled to said second primary winding terminals of respective ones of said transformers to effect selecting of one of said transformers;

(f) second decoding means having a second group of output conductors responsive to said digital address signal for producing a field effect transistor selection signal on a one of said conductors of said second group, said output conductors of said second group being coupled, respectively, to said gate electrodes of respective ones of said field effect transistors, said second decoding means selecting a one of said field effect transistors having its second current conducting terminal coupled to the second terminal of a secondary winding of said selected transformer;

(g) first current producing means coupled to said first terminals of said first primary winding of each of said transformers for producing a first current pulse in said first primary winding of said selected ones of said transformers during a read memory cycle, said first current pulse causing a read select current to flow in a first direction through said selected field effect transistor, the one of said secondary windings coupled to said selected field effect transistor, and the selected one of said select lines; and (i) second current producing means coupled to said second terminals of said second primary windings of each of said transformers for producing a second current pulse in said second primary windings of said selected one of said transformers during a restore or write memory cycle, said second current pulse causing a write current pulse to flow in a second direction through said selected field effect transistor, said one of said secondary windings, and said selected one of said select lines.

18. A core memory system comprising in combination:

(a) an array of memory cores, including a plurality of groups of said memory cores;

(b) a plurality of select lines, each extending through each memory core of a respective one of said groups, each of said select lines having a first end and a second end, each of said second ends being coupled to a first supply voltage conductor;

(c) a plurality of field effect transistors each having a gate electrode and first and second current conducting electrodes, the first current conducting electrode of each of said field effect transistors being coupled to a second supply voltage conductor;

(d) a plurality of transformers, each having a plurality of secondary windings and a first primary winding, each of said primary and secondary windings having first and second terminals, said second terminals of said secondary windings being coupled to said second current conducting electrodes of respective ones of said field effect transistors;

(e) first decoding means having a first group of output conductors and responsive to a digital address signal for producing a transformer selection signal on a one of said output conductors determined by said digital address signal, said output conductors being coupled to said first primary winding terminals of respective ones of said transformers to effect selecting of one of said transformers;

(f) second decoding means, having a second group of output conductors, responsive to said digital address signal for producing a field effect transistor selection signal on a one of said conductors of said second group, said output conductors of said second group being coupled, respectively, to said gate electrodes of respective ones of said field effect transistors, said second decoding means selecting a one of said field effect transistors having its second current conducting terminal coupled to the second terminal of a secondary winding of said selected transformer;

(g) first current producing means coupled to said first primary windings of each of said transformers for producing a first current pulse in said first primary winding of said selected one of said transformers during a read memory cycle, said first current pulse causing a read select current to flow in a first direction through said selected field effect transistor, the one of said secondary windings coupled to said selected field effect transistor, and the selected one of said select lines; and (i) second current producing means coupled to said first primary windings of each of said transformers for producing a second current pulse in said first primary winding of said selected one of said transformers during a restore or write memory cycle, said second current pulse causing a write current pulse to flow in a second direction through said selected field effect transistor, said one of said secondary windings, and said selected one of said select lines.

19. The core memory system of claim 18 where each of said transformers has a second primary winding, said second terminal of said first primary winding being coupled to said first terminal of said second primary windings, said first terminal of said secondary windings being coupled to said first ends of respective ones of said select lines.

20. A method of operating a core memory system including (i) an array of memory cores, including a plurality of groups of said cores;

(ii) a plurality of select lines each extending through each core in a respective one of said groups;

(iii) a plurality of pairs of balanced sense/inhibit lines, each of said pairs including a first sense/inhibit line and a second sense/inhibit line, said method comprising the steps of:

(a) coupling each of said first sense/inhibit lines to a first input conductor of a sense amplifier by turning on a respective first field effect transistor and also coupling each of said second sense/inhibit lines to a second input conductor of the sense amplifier by turning on a respective second field effect transistor;

(b) turning off all of the field effect transistors except the two coupling a selected one of the pairs of sense/inhibit lines to the first and second input conductors, said turning off causing parasitic charge to be capacitively coupled onto the first and second input conductors and also onto the respective select lines;

(c) conducting at least some of said parasitic charge away from the first and second input conductors of the sense amplifier by means of first and second resistive termination elements coupled to the first and second input conductors, respective, and conducting at least some of said parasitic charge from the selected select lines through the two turned on field effect transistors onto the first and second input conductors and through the first and second resistive termination elements;

(d) forcing a read select current to flow through a selected one of the select lines passing through a selected core through which one of the sense/inhibit lines of the selected pair also passes before decay of parasitic voltages due to the parasitic charge on the unselected select lines, said read select current causing a sense voltage representative of a stored state in the selected core to be induced on one of the sense/inhibit lines of the selected pair; and (e) coupling said sense voltage to one of the first and second input conductors of the sense amplifier.

21. The method of claim 20 including the steps of forcing a relatively large inhibit current to flow through the selected pair of sense/inhibit lines and through the two field effect transistors coupling the sense/inhibit lines of the selected pair to the first and second input conductors during a write or restore cycle.

22. A core memory system comprising in combination:
 (a) an array of memory cores, including a plurality of groups of said memory cores;
 (b) a plurality of select lines, each extending through each memory core of a respective one of said groups, each of said select lines having a first end and a second end, each of said second ends being coupled to a first conductor;
 (c) first, second, third, fourth, fifth and sixth field effect transistors each having a gate electrode and first and second current conducting electrodes;
 (d) first current driving means coupled to the first current conducting electrodes of said first and second field effect transistors for controllably forcing a read select current to flow through a selected one of said first and second field effect transistors during a read memory cycle;
 (e) second current driving means coupled to said first current conducting electrodes of said first and second field effect transistors for controllably forcing a restore or write select current to flow through said selected one of said first and second field effect transistors during a restore or write select cycle;
 (f) means for (i) coupling said second current conducting electrode of said first field effect transistor to said first current conducting electrodes of said third and fourth field effect transistors, respectively, and (ii) coupling said second current conducting electrode of said second field effect transistor to said first current conducting electrodes of said fifth and sixth field effect transistors, respectively;
 (g) first selection circuit means responsive to a digital memory address for producing a first gate control signal, and a second gate control signal which is the logical complement of said first gate control signal, and applying said first gate control signal to said gate electrode of said first field effect transistor and applying said second gate control signal to said gate electrode of said second field effect transistor; and
 (h) second selection circuit means responsive to said digital memory address for producing a third gate control signal, and a fourth gate control signal which is the logical complement of said third gate control signal, and applying said third gate control signal to said gate electrodes of said third and fifth field effect transistors and applying said fourth gate control signal to said gate electrodes of said fourth and sixth field effect transistors.

* * * * *